(12) United States Patent
Scott, III (10) Patent No.: US 10,678,449 B2
(45) Date of Patent: Jun. 9, 2020

(54) INCREASING FLASH MEMORY RETENTION TIME USING WASTE HEAT

(71) Applicant: Microsoft Technology Licensing, LLC, Redmond, WA (US)

(72) Inventor: George Easton Scott, III, Redmond, WA (US)

(73) Assignee: MICROSOFT TECHNOLOGY, LLC, Redmond, WA (US)

( * ) Notice: Subject to any disclaimer, the term of this patent is extended or adjusted under 35 U.S.C. 154(b) by 0 days.

(21) Appl. No.: 15/970,317

(22) Filed: May 3, 2018

(65) Prior Publication Data

US 2019/0339881 A1 Nov. 7, 2019

(51) Int. Cl.
*G06F 1/20* (2006.01)
*G06F 3/06* (2006.01)

(52) U.S. Cl.
CPC ............ *G06F 3/0619* (2013.01); *G06F 1/206* (2013.01); *G06F 3/0679* (2013.01)

(58) Field of Classification Search
CPC ....... G06F 3/0619; G06F 1/206; G06F 3/0679
See application file for complete search history.

(56) References Cited

U.S. PATENT DOCUMENTS

| | | | |
|---|---|---|---|
| 6,009,033 A | 12/1999 | Li et al. | |
| 7,919,807 B1 | 4/2011 | Babcock et al. | |
| 8,958,242 B2 | 2/2015 | Vanalli et al. | |
| 9,292,210 B1 | 3/2016 | Campbell et al. | |
| 9,317,083 B2* | 4/2016 | Vyshetsky | G06F 1/206 |
| 9,798,334 B1* | 10/2017 | Tabrizi | G05D 23/1902 |
| 2013/0133339 A1 | 5/2013 | Kim | |
| 2014/0041827 A1 | 2/2014 | Giaimo et al. | |
| 2015/0094875 A1* | 4/2015 | Duzly | G05D 23/1919 700/300 |
| 2016/0092351 A1 | 3/2016 | Uematsu et al. | |
| 2017/0071056 A1 | 3/2017 | Stoev et al. | |
| 2017/0110194 A1* | 4/2017 | Tiwari | G11C 16/12 |
| 2019/0094927 A1* | 3/2019 | Kuwano | G06F 1/206 |

OTHER PUBLICATIONS

WU, et al., "Exploiting Heat-Accelerated Flash Memory Wear-Out Recovery to Enable Self-Healing SSDs", In Proceedings of 3rd USENIX Workshop on Hot Topics in Storage and File Systems, Jun. 14, 2011, 5 Pages.

"International Search Report and Written Opinion Issued in PCT Application No. PCT/US2019/028595", dated Jul. 23, 2019, 12 Pages.

* cited by examiner

*Primary Examiner* — David Yi
*Assistant Examiner* — Dustin B. Fulford
(74) *Attorney, Agent, or Firm* — Arent Fox LLP (57) ABSTRACT

A system for increasing data retention time can include a processor to execute code to detect or predict a write event associated with a flash memory. The processor can also control a device to cause a temperature at the flash memory to increase via waste heat in response to the write event. Additionally, the processor can write data to the flash memory at the increased temperature to increase the retention time of the data stored in the flash memory.

20 Claims, 5 Drawing Sheets

INCREASING FLASH MEMORY RETENTION TIME USING WASTE HEAT

BACKGROUND

Flash memory is an electronic (solid-state) non-volatile computer storage medium that can be electrically erased and reprogrammed. In some examples, flash memory can be used to store files including operating systems, applications, games, media, or any other content.

SUMMARY

The following presents a simplified summary in order to provide a basic understanding of some aspects described herein. This summary is not an extensive overview of the claimed subject matter. This summary is not intended to identify key or critical elements of the claimed subject matter nor delineate the scope of the claimed subject matter. This summary's sole purpose is to present some concepts of the claimed subject matter in a simplified form as a prelude to the more detailed description that is presented later.

An embodiment described herein includes a system for increasing data retention time that can include a processor to execute code to detect or predict a write event associated with a flash memory. The processor can also control a device in the system to cause a temperature at the flash memory to increase via waste heat in response to the write event. The processor can write data to the flash memory at the increased temperature to increase the retention time of the data stored in the flash memory.

In another embodiment described herein, a method for increasing data retention time can include detecting or predicting, via a processor, a write event associated with a flash memory. The method can also include controlling, via the processor, a device to cause a temperature at the flash memory to increase via waste heat in response to the write event. Additionally, the method can include writing, via the processor, data to the flash memory at the increased temperature to increase the retention time of the data stored in the flash memory.

In another embodiment described herein, one or more computer-readable storage media for increasing data retention time can include a plurality of instructions that, in response to execution by a processor, cause the processor to detect or predict a write event associated with a flash memory. The plurality of instructions can also cause the processor to control a device to cause a temperature at the flash memory to increase via waste heat in response to the write event. The plurality of instructions can also cause the processor to write data to the flash memory at the increased temperature to increase the retention time of the data stored in the flash memory.

The following description and the annexed drawings set forth in detail certain illustrative aspects of the claimed subject matter. These aspects are indicative, however, of a few of the various ways in which the principles of the innovation may be employed and the claimed subject matter is intended to include all such aspects and their equivalents. Other advantages and novel features of the claimed subject matter will become apparent from the following detailed description of the innovation when considered in conjunction with the drawings.

BRIEF DESCRIPTION OF THE DRAWINGS

The following detailed description may be better understood by referencing the accompanying drawings, which contain specific examples of numerous features of the disclosed subject matter.

DETAILED DESCRIPTION

As described above, flash memory can be used to store files including operating systems, applications, games, media, or any other content. However, the data written to flash memory may have a limited storage time. For example, data may be lost or corrupted after about a year of being stored at room temperature.

In embodiments described herein, a system can increase flash memory retention time using waste heat. As used herein, waste heat refers to heat produced as a side-effect of operation of one or more devices. For example, waste heat may normally be vented to the outside environment. The system described herein can detect or predict a write event associated with a flash memory. For example, the system can include a processor to execute instructions to detect or predict that an amount of data to be written to the flash memory exceeds a threshold amount. The processor can then control a device to cause a temperature at the flash memory to increase via waste heat in response to the write event. For example, the temperature may be increased to a write temperature to increase data retention time on the flash memory. As used herein, retention time refers to the time in which data stored to flash memory is reliably stored and can be read without any errors or corruption. The write temperature may be above a first predetermined threshold temperature and below a second predetermined threshold temperature. For example, the second predetermined threshold may be a temperature at which reliability of the flash memory device is reduced. The system can write data to the flash memory at the increased temperature to increase the retention time of the data stored in the flash memory while not significantly impacting reliability of the flash memory.

In some embodiments, the system described herein can also measure the temperature at the flash memory. For example, a sensor may be located on a die of the flash memory or proximate to the flash memory. The system may then detect an end of the write event and cause the temperature at the flash memory to decrease in response to detecting the end of the write event. For example, the system may resume thermal throttling to maintain a preset operating temperature that may be lower than the write temperature.

In some examples, a thermal sensor may be used to manage the flash temperature with greater accuracy. For example, the thermal sensor may be used to measure then adjust the flash temperature, rather than estimating the temperature and making adjustments.

Thus, the present techniques enable increased retention time of data in flash memory using waste heat. Increasing the temperature during a write operation to flash memory may enable the flash memory to retain the data longer. For example, the techniques described herein may be useful in devices, such as game consoles, that may not have power for an extended period of time.

Figure 1:
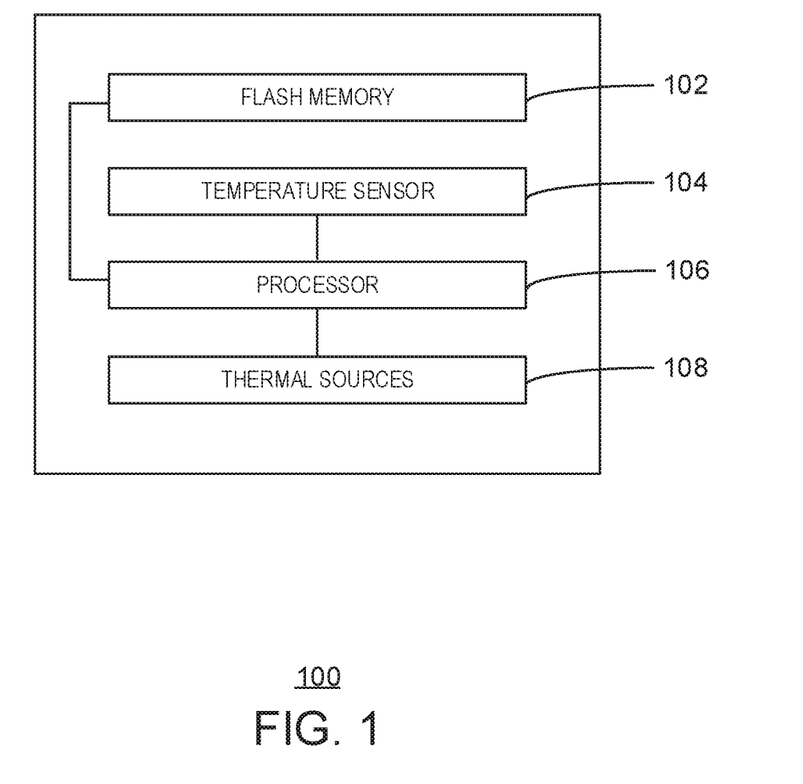
FIG. 1 is a block diagram illustrating an example computing device that can increase flash memory retention time using waste heat.

FIG. 1 is an example block diagram illustrating a computing device that can increase flash memory retention time using waste heat. In some embodiments, the computing device 100 can include flash memory 102, at least one temperature sensor 104, a processor 106, and one or more thermal sources 108. In some examples, the flash memory 102 may include a flash controller that can manage data stored in the flash memory 102 or retrieved from the flash memory 102. The temperature sensor 104 may be any temperature measurement devices that can read temperature near the flash memory 102. For example, the temperature sensor 102 may be a single sensor or multiple sensors for increased accuracy. The thermal sources 108 can include processors, such as CPUs or GPUs, power supplies, or any other heat-emitting devices. As shown in FIG. 1, the processor 106 may be electrically coupled to the flash memory 102 and the temperature sensor 104. In some examples, the processor 106 may also be optionally electrically coupled to the one or more thermal sources 108. In some examples, the flash memory 102 may be thermally coupled to the one or more thermal sources 108. For example, the flash memory 102 and one or more thermal sources 108 may share a heatsink or a heat pipe. In some examples, the flash memory 102 and the thermal sources 108 may be located in a shared container. For example, the shared container may include cooling fans with adjustable speeds for regulation of waste heat.

In some embodiments, the processor 106 can detect or predict a write event associated with the flash memory 102. For example, the write event may be a game download, an application download, an operating system update, or any other data to be written to a flash memory. In some examples, the write event may include writing of data to the flash memory having a size exceeding a predetermined threshold size. For example, write events with small amounts of data may not be worth the time and effects on longevity on the flash memory to raise the temperature. Thus, the temperature may be raised to the write temperature in response to detecting that the write event includes data having a size exceeding the threshold. In some examples, the data may be a game, application, media, or updates to a game, application, or operating system. In response to detecting the write event, the processor 106 may cause an increase in temperature using waste heat from the one or more thermal sources 108. For example, the control mechanism can be an active vent or flap that may be used to control the exhaust of waste heat. In some examples, the increase in temperature may be indirectly caused by the processor 106 by controlling how much work the thermal sources 108, such as a CPU or GPU, are performing. For example, dummy workloads may be used if insufficient work is available. Otherwise, the processor 106 may disable throttling of one or more thermal sources to increase the temperature.

In some examples, the processor 106 can monitor the temperature at the temperature sensor 104 to adjust the temperature to a write temperature. For example, the write temperature may be above a first determined threshold and below a second determined threshold. In some examples, the thresholds may be determined based on a number of flash writes to be performed, a current status of the one or more thermal sources 108, or an age of the flash memory. For example, the second threshold may be limited to prolong the longevity of the flash memory if the age of the flash memory is below a threshold time. By contrast, if the flash memory is near end of life, then the second threshold may be raised to provide a higher temperature for writing data. For example, the processor may detect that a memory is near an end of life using information received from a flash memory controller including write cycles and an estimated lifetime in cycles. If the flash memory exceeds a threshold number of writes, then the processor may detect that the flash memory is near end of life and raise the second threshold accordingly. In addition to counting flash write cycles, the flash controller may also count the number of read errors encountered when reading the flash block. For example, increasing read errors may indicate that the data needs to be rewritten to the flash block and the number of reads between re-write events indicate that the flash block is wearing out.

In some examples, the write temperature may be determined and adjusted using a proportional-integral-differential (PID) controller and other control loops or control devices. For example, proportional loops, integral loops, or any combination thereof may be used to determine the write temperature or a temperature range corresponding to the write temperature. In some examples, fuzzy logic, machine learning, neural networks, or on/off controllers may be used to determine the write temperature or a temperature range corresponding to the write temperature. In some examples, the threshold temperatures to be used may be determined using a table. For example, the table may include threshold temperatures to be used in a variety of operating conditions and flash devices. The data may then be written to the flash memory 102 at the write temperature. In some examples, the data may be downloaded from a network, or copied, or loaded from a CD-ROM or any other external memory source onto the flash memory. Once the data transfer is complete, the processor may detect an end of a write event and lower the temperature back to a predetermined operation temperature. For example, the processor 106 can reduce workload on the thermal sources 108 or enable processor throttling, open one or more ducts to release waste heat out of the system, adjust the speed of one or more cooling fans, or reduce the temperature using any of the techniques described herein. The data written to the flash memory 102 may thus benefit from increased retention time due to the higher writing temperature when it was stored.

It is to be understood that the block diagram of FIG. 1 is not intended to indicate that the system 100 is to include all of the components shown in FIG. 1. Rather, the computing device 100 can include fewer or additional components not illustrated in FIG. 1 (e.g., additional memory, sensors, processors, thermal sources, no sensors, etc.).

Figure 2:
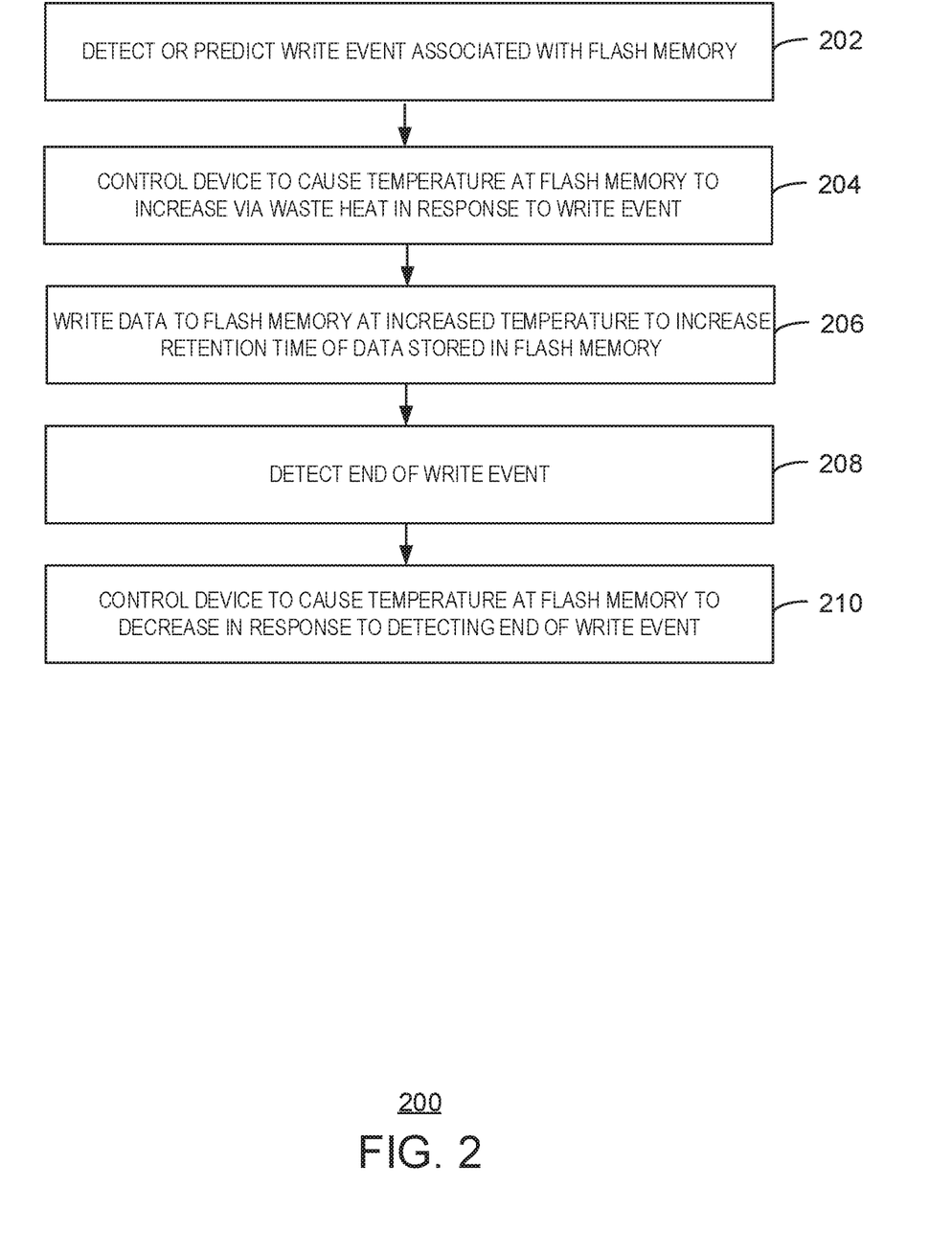
FIG. 2 is a process flow diagram of an example method for increasing flash memory retention time using waste heat.

FIG. 2 is a process flow diagram of an example method for increasing flash memory retention time using waste heat. The method 200 can be implemented with any suitable computing device, such as the computing system 402 of FIG. 4.

At block 202, a processor detects or predicts a write event associated with a flash memory. In some examples, a write event may be detected or predicted based on an update or download screen being detected. For example, a gaming console may have an update or download screen that may be used to predict a write event associated with the flash memory. In some examples, the update or download screen may include data sizes to be downloaded. The data to be downloaded may be additional games, applications, updates to games, applications, or an operating system. In some examples, the temperature control mechanism may be available to an OS write buffer routine. For example, the OS buffer may write data into RAM before committing the data to the storage medium for performance reasons. In some examples, a system update process may query the cloud to see how much data is to be written before the update starts.

At block 204, the processor controls a device to cause a temperature at the flash memory to increase via waste heat in response to the write event. For example, the processor may cause the temperature to increase to a write temperature. The write temperature may be a temperature above a first predetermined threshold temperature and below a second predetermined threshold temperature. In some examples, the processor can determine a write temperature based on a detected number of flash writes to be performed. For example, the amount of time needed to raise the write temperature versus the amount of data to be written may be adjusted, as it may take seconds or minutes to heat or cool the system. In some examples, the processor can determine the write temperature based on a status of a thermal source of the waste heat. The second threshold may similarly be determined based on one or both of these factors. In some examples, the threshold temperatures to be used may be determined using a table. The processor can cause the temperature to increase by reducing a speed of a fan in the system. For example, reducing fan speed may cause overall system temperature to rise and thus increase the temperature of the flash memory. In some examples, the processor can cause the temperature to increase by executing additional instructions. For example, the processor may execute additional instructions by reducing throttling and thus producing additional waste heat. The additional waste heat generated by the processor may be used to increase the temperature of the flash memory. In some examples, the processor can control an active cooling device at the flash memory. For example, the active cooling device may be a fan, a water cooler, or a vapor cooler thermally coupled to the flash memory.

At block 206, the processor writes data to the flash memory at the increased temperature to increase the retention time of the data stored in the flash memory. For example, the data may be written to flash memory as it is downloaded via a network, another memory storage device, or any other source of data. The data written to the flash memory at the increased temperature may then be stored at room temperature for increased amounts of time with reduced data loss or corruption.

At block 208, the processor detects an end of the write event. For example, the processor may detect that the data in the write event has been stored to the flash memory. In some examples, the processor may detect an end of write event when an end of the downloaded data is reached. In some examples, the processor may detect an amount of data in the write cache or how fast the write cache is getting filled. The amount of data or rate that the write cache is being written to may also be used as triggers to start or stop the thermal process. In some examples, the read request rate may be used to reduce the temperatures. Thus, the processor may reduce the temperature such that data may be read at a predetermined normal operation temperature.

At block 210, the processor controls the device to cause the temperature at the flash memory to decrease in response to detecting the end of the write event. For example, the processor can cause a processor throttling to resume operation to reduce waste heat from the processor. The processor may also cause a dummy workload to stop being processed. In some examples, the processor can cause an active cooling device to reduce temperature near the flash memory. For example, the processor may cause a fan into increase in speed. In some examples, the processor can open one or more vents to release waste heat from one or more thermal sources.

In one embodiment, the process flow diagram of FIG. 2 is intended to indicate that the steps of the method 200 are to be executed in a particular order. Alternatively, in other embodiments, the steps of the method 200 can be executed in any suitable order and any suitable number of the steps of the method 200 can be included. Further, any number of additional steps may be included within the method 200, depending on the specific application.

Figure 3:
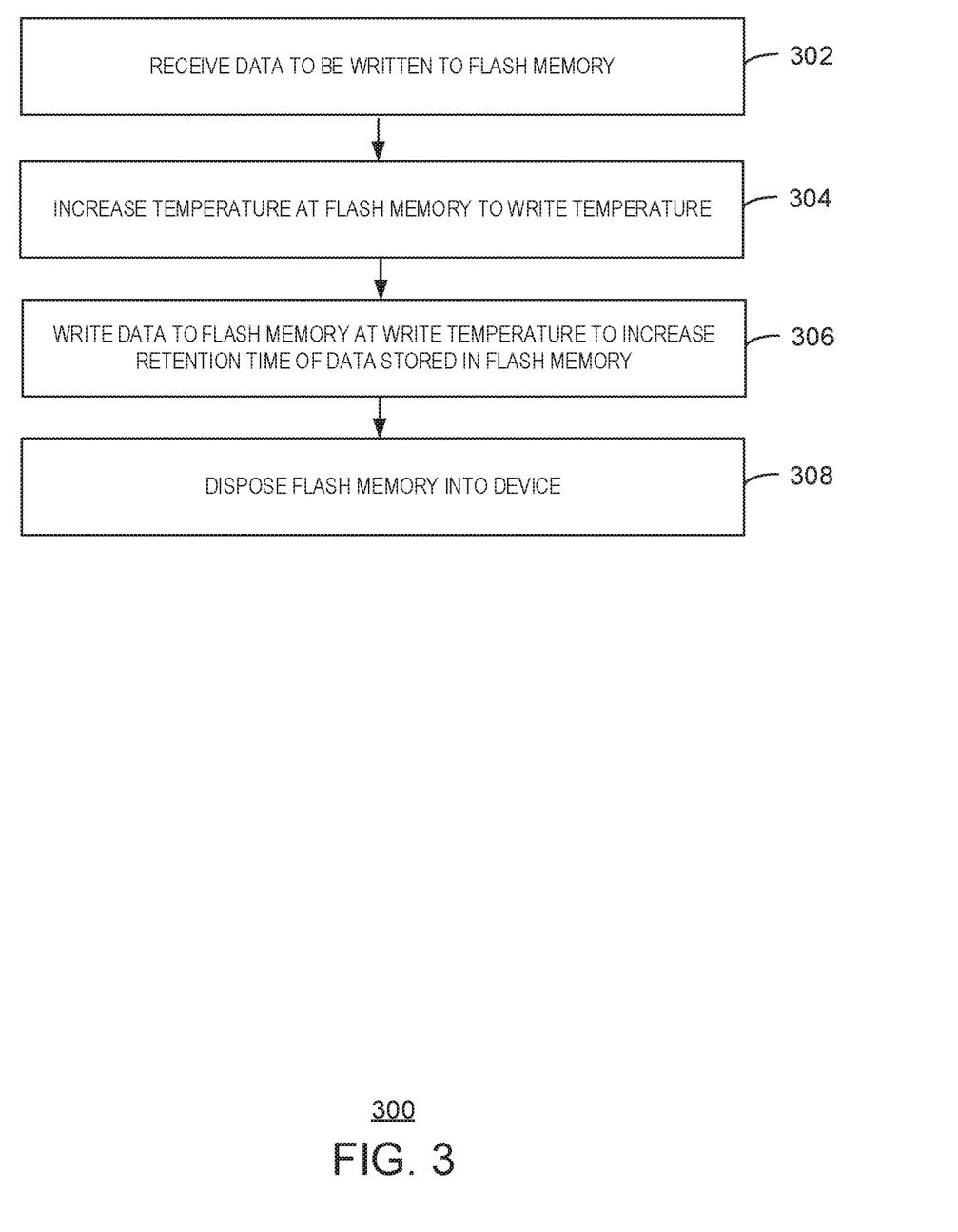
FIG. 3 is a process flow diagram of an example method for increasing flash memory retention time using a write temperature in manufacturing a device.

FIG. 3 is a process flow diagram of an example method for increasing flash memory retention time using a write temperature in manufacturing a device. The method 300 can be used to manufacture a computing device, such as the computing system 402 of FIG. 4.

At block 302, data to be written to a flash memory is received. For example, the data may be an operating system, applications, games, or content, such as music or videos. The data may be an image of a known size to be written to the flash memory.

At block 304, the temperature at the flash memory is increased to a write temperature. In some examples, the write temperature may be based on detected number of flash writes to be performed. For example, the write temperature may exceed a first threshold temperature but not exceed a second threshold temperature. In some examples, the first threshold temperature and second temperature threshold may be set to match the flash parts or different usage scenarios of the computing device. For example, higher temperature thresholds may be used for more permanent parts of the flash image, and a low temp for transient portions. Thus, as described below, the data may be written during a thermal ramp, since it may take time for a system to reach the thermal threshold. Therefore, time may be saved during manufacturing of the computing device by writing different data to the flash memory as the temperature increases.

At block 306, data is written to the flash memory at the write temperature to increase retention time of the data stored in the flash memory. For example, the retention time may be increased by a number of months by increasing the temperature by several degrees centigrade. In some examples, data may be written at different write temperatures based on the usage scenario of the data.

At block 308, the flash memory is disposed into a device. For example, the device may be a gaming system, a laptop, a desktop computer, a mobile device, or any other device using flash memory.

In one embodiment, the process flow diagram of FIG. 3 is intended to indicate that the steps of the method 300 are to be executed in a particular order. Alternatively, in other embodiments, the steps of the method 300 can be executed in any suitable order and any suitable number of the steps of the method 300 can be included. Further, any number of additional steps may be included within the method 300, depending on the specific application.

Figure 4:
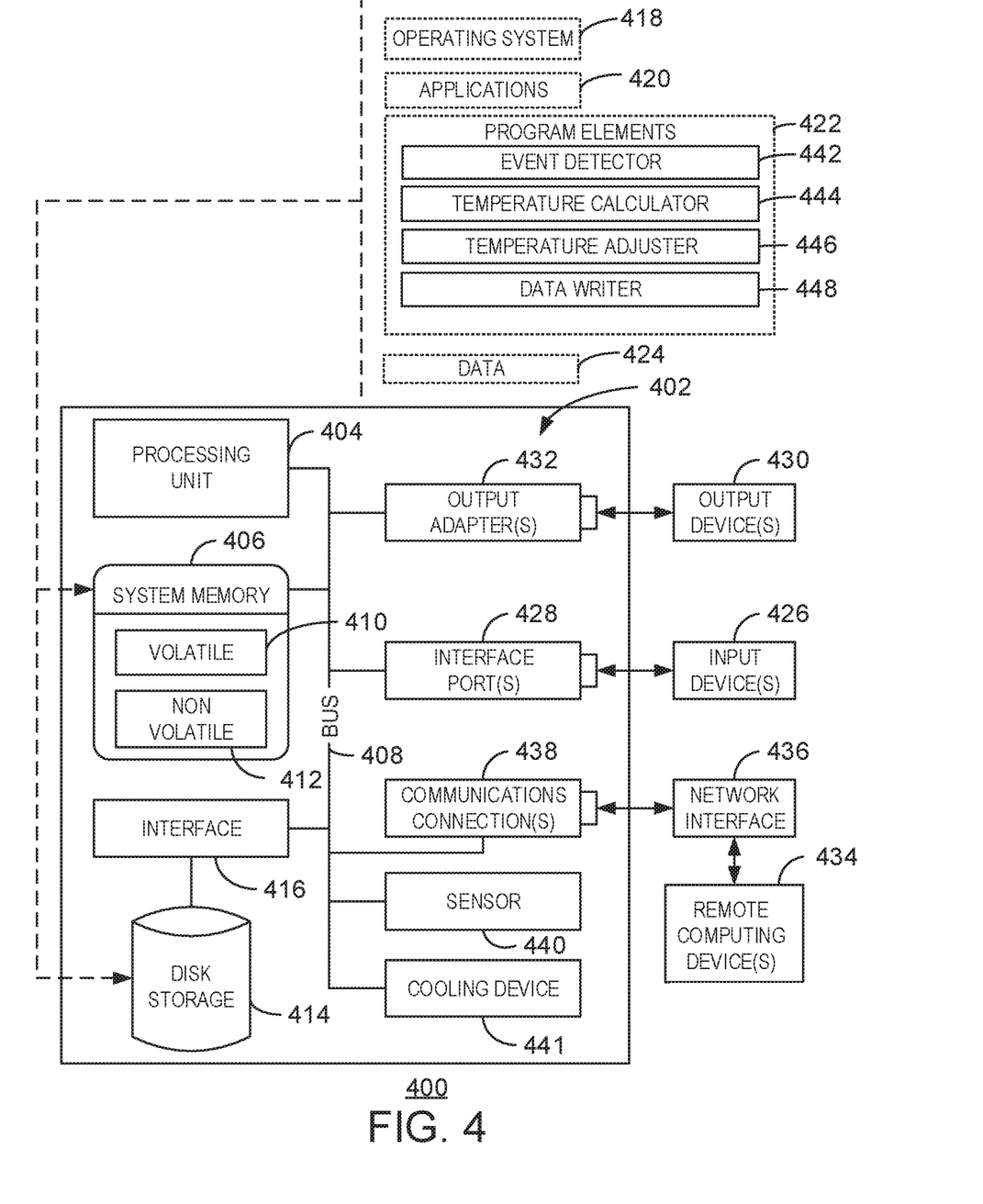
FIG. 4 is a block diagram of an example of a computing system that can increase flash memory retention time using waste heat.

Some of the figures describe concepts in the context of one or more structural components, referred to as functionalities, modules, features, elements, etc. The various components shown in the figures can be implemented in any manner, for example, by software, hardware (e.g., discrete logic components, etc.), firmware, and so on, or any combination of these implementations. In one embodiment, the various components may reflect the use of corresponding components in an actual implementation. In other embodiments, any single component illustrated in the figures may be implemented by a number of actual components. The depiction of any two or more separate components in the figures may reflect different functions performed by a single actual component. FIG. 4 discussed below, provides details regarding different systems that may be used to implement the functions shown in the figures.

Other figures describe the concepts in flowchart form. In this form, certain operations are described as constituting distinct blocks performed in a certain order. Such implementations are exemplary and non-limiting. Certain blocks described herein can be grouped together and performed in a single operation, certain blocks can be broken apart into plural component blocks, and certain blocks can be performed in an order that differs from that which is illustrated herein, including a parallel manner of performing the blocks. The blocks shown in the flowcharts can be implemented by software, hardware, firmware, and the like, or any combination of these implementations. As used herein, hardware may include computer systems, discrete logic components, such as application specific integrated circuits (ASICs), and the like, as well as any combinations thereof.

As for terminology, the phrase "configured to" encompasses any way that any kind of structural component can be constructed to perform an identified operation. The structural component can be configured to perform an operation using software, hardware, firmware and the like, or any combinations thereof. For example, the phrase "configured to" can refer to a logic circuit structure of a hardware element that is to implement the associated functionality. The phrase "configured to" can also refer to a logic circuit structure of a hardware element that is to implement the coding design of associated functionality of firmware or software. The term "module" refers to a structural element that can be implemented using any suitable hardware (e.g., a processor, among others), software (e.g., an application, among others), firmware, or any combination of hardware, software, and firmware.

The term "logic" encompasses any functionality for performing a task. For instance, each operation illustrated in the flowcharts corresponds to logic for performing that operation. An operation can be performed using software, hardware, firmware, etc., or any combinations thereof.

As utilized herein, terms "component," "system," "client" and the like are intended to refer to a computer-related entity, either hardware, software (e.g., in execution), and/or firmware, or a combination thereof. For example, a component can be a process running on a processor, an object, an executable, a program, a function, a library, a subroutine, and/or a computer or a combination of software and hardware. By way of illustration, both an application running on a server and the server can be a component. One or more components can reside within a process and a component can be localized on one computer and/or distributed between two or more computers.

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any tangible, computer-readable device, or media.

Computer-readable storage media can include but are not limited to magnetic storage devices (e.g., hard disk, floppy disk, and magnetic strips, among others), optical disks (e.g., compact disk (CD), and digital versatile disk (DVD), among others), smart cards, and flash memory devices (e.g., card, stick, and key drive, among others). In contrast, computer-readable media generally (i.e., not storage media) may additionally include communication media such as transmission media for wireless signals and the like.

FIG. 4 is a block diagram of an example of a computing system that can increase flash memory retention time using waste heat. The example system 400 includes a computing device 402. The computing device 402 includes a processing unit 404, a system memory 406, and a system bus 408. In some examples, the computing device 402 can be a gaming console, a personal computer (PC), an accessory console, a gaming controller, a laptop, or a mobile device, among other computing devices. In some examples, the computing device 402 can be a node in a cloud network.

The system bus 408 couples system components including, but not limited to, the system memory 406 to the processing unit 404. The processing unit 404 can be any of various available processors. Dual microprocessors and other multiprocessor architectures also can be employed as the processing unit 404.

The system bus 408 can be any of several types of bus structure, including the memory bus or memory controller, a peripheral bus or external bus, and a local bus using any variety of available bus architectures known to those of ordinary skill in the art. The system memory 406 includes computer-readable storage media that includes volatile memory 410 and nonvolatile memory 412.

The basic input/output system (BIOS), containing the basic routines to transfer information between elements within the computer 402, such as during start-up, is stored in nonvolatile memory 412. By way of illustration, and not limitation, nonvolatile memory 412 can include read-only memory (ROM), programmable ROM (PROM), electrically programmable ROM (EPROM), electrically erasable programmable ROM (EEPROM), or flash memory.

Volatile memory 410 includes random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), SynchLink™ DRAM (SLDRAM), Rambus® direct RAM (RDRAM), direct Rambus® dynamic RAM (DRDRAM), and Rambus® dynamic RAM (RDRAM).

The computer 402 also includes other computer-readable media, such as removable/non-removable, volatile/nonvolatile computer storage media. FIG. 4 shows, for example a disk storage 414. Disk storage 414 includes, but is not limited to, devices like a magnetic disk drive, floppy disk drive, tape drive, Jaz drive, Zip drive, LS-210 drive, flash memory, memory sticks, punch cards, or paper tape. The disk storage may be a flash memory used for operating system storage, game storage, media storage, etc.

In addition, disk storage 414 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 414 to the system bus 408, a removable or non-removable interface is typically used such as interface 416.

It is to be appreciated that FIG. 4 describes software that acts as an intermediary between users and the basic computer resources described in the suitable operating environment 400. Such software includes an operating system 418.

Operating system 418, which can be stored on disk storage 414, acts to control and allocate resources of the computer 402.

System applications 420 take advantage of the management of resources by operating system 418 through program elements 422 and program data 424 stored either in system memory 406 or on disk storage 414. It is to be appreciated that the disclosed subject matter can be implemented with various operating systems or combinations of operating systems.

A user enters commands or information into the computer 402 through input devices 426. Input devices 426 include, but are not limited to, a pointing device, such as, a mouse, trackball, stylus, and the like, a keyboard, a microphone, a joystick, a satellite dish, a scanner, a TV tuner card, a digital camera, a digital video camera, a web camera, and the like. In some examples, an input device can include Natural User Interface (NUI) devices. NUI refers to any interface technology that enables a user to interact with a device in a "natural" manner, free from artificial constraints imposed by input devices such as mice, keyboards, remote controls, and the like. In some examples, NUI devices include devices relying on speech recognition, touch and stylus recognition, gesture recognition both on screen and adjacent to the screen, air gestures, head and eye tracking, voice and speech, vision, touch, gestures, and machine intelligence. For example, NUI devices can include touch sensitive displays, voice and speech recognition, intention and goal understanding, and motion gesture detection using depth cameras such as stereoscopic camera systems, infrared camera systems, RGB camera systems and combinations of these. NUI devices can also include motion gesture detection using accelerometers or gyroscopes, facial recognition, three-dimensional (3D) displays, head, eye, and gaze tracking, immersive augmented reality and virtual reality systems, all of which provide a more natural interface. NUI devices can also include technologies for sensing brain activity using electric field sensing electrodes. For example, a NUI device may use Electroencephalography (EEG) and related methods to detect electrical activity of the brain. The input devices 426 connect to the processing unit 404 through the system bus 408 via interface ports 428. Interface ports 428 include, for example, a serial port, a parallel port, a game port, and a universal serial bus (USB).

Output devices 430 use some of the same type of ports as input devices 426. Thus, for example, a USB port may be used to provide input to the computer 402 and to output information from computer 402 to an output device 430.

Output adapter 432 is provided to illustrate that there are some output devices 430 like monitors, speakers, and printers, among other output devices 430, which are accessible via adapters. The output adapters 432 include, by way of illustration and not limitation, video and sound cards that provide a means of connection between the output device 430 and the system bus 408. It can be noted that other devices and systems of devices provide both input and output capabilities such as remote computing devices 434.

The computer 402 can be a server hosting various software applications in a networked environment using logical connections to one or more remote computers, such as remote computing devices 434. The remote computing devices 434 may be client systems configured with web browsers, PC applications, mobile phone applications, and the like. The remote computing devices 434 can be a personal computer, a server, a router, a network PC, a workstation, a microprocessor based appliance, a mobile phone, a peer device or other common network node and the like, and typically includes many or all of the elements described relative to the computer 402.

Remote computing devices 434 can be logically connected to the computer 402 through a network interface 436 and then connected via a communication connection 438, which may be wireless. Network interface 436 encompasses wireless communication networks such as local-area networks (LAN) and wide-area networks (WAN). LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection 438 refers to the hardware/software employed to connect the network interface 436 to the bus 408. While communication connection 438 is shown for illustrative clarity inside computer 402, it can also be external to the computer 402. The hardware/software for connection to the network interface 436 may include, for exemplary purposes, internal and external technologies such as, mobile phone switches, modems including regular telephone grade modems, cable modems and DSL modems, ISDN adapters, and Ethernet cards.

The computer 402 can further include a sensor 440. For example, the sensor 440 can be a temperature sensor. For example, the sensor 440 can be a thermistor, a thermocouple, a resistance thermometer, or a silicon bandgap temperature sensor. In some examples, the sensor 440 can be a set of two or more sensors for improved reliability and consistency. For example, an average of two or more sensor values may be used as a temperature reading. In some examples, the sensor 440 may be located near the flash memory such as disk storage 414. In some examples, the sensor 440 may be located on a die of the flash memory such as disk storage 414. In some examples, the sensor 440 may be a forward-looking infrared (FLIR) imaging device that can sense infrared radiation. For example, the sensor 440 can estimate the temperature of a flash memory based on the detected amount of infrared radiation generated from the surface of the flash memory.

The computer 402 can also further include one or more cooling devices 441. In some examples, the cooling devices 441 may include a dedicated cooling device coupled to the flash memory 414 and controllable by the processor 404 to increase or decrease the temperature at the flash memory such as the disk storage 414. For example, the cooling device 441 may be an active cooling device coupled to the processor 404 via the bus 408. In some examples, the cooling device 441 may include a fan. For example, the fan may be coupled to a heat sink. The heat sink may be coupled to the flash memory 414. In some examples, the cooling device 441 may include a thermoelectric device. For example, the thermoelectric device may use the Peltier effect to transfer heat from one area to another via an applied current across two heat conductors. The cooling device 441 may include water cooling devices. For example, the water cooling devices may include a pump that may be controllable by the processor 404. In some examples, the cooling device 441 may be a passive cooling device coupled to both flash memory, such as disk storage 414, and a waste heat emitting device such as the processor 404. The cooling device 441 may be a heat sink or a heat pipe. For example, the cooling device 441 may be a vapor chamber.

The computer 402 includes one or more program elements 422, such as an event detector 442, a temperature calculator 444, a temperature adjuster 446, and a data writer 448. In some embodiments, the event detector 442 can detect or predict a write event associated with a flash memory such as disk storage 414. In some examples, the event detector 442 can also detect an end of the write event.

The temperature calculator 444 can determine a write temperature. For example, the write temperature may be greater than a first determined threshold and less than a second determined threshold. In some examples, the temperature calculator 444 can determine the write temperature based on detected number of flash writes to be performed, or a current status of a thermal source of the waste heat, an age of the flash memory, or any combination thereof. In some examples, the threshold temperatures of the write temperature may be determined using a table.

The temperate adjuster 446 can control a device to cause a temperature at the flash memory to increase via waste heat in response to the write event. In some examples, the temperature adjuster 446 can reduce a speed of a fan in the system. For example, the temperature adjuster 446 can increase the waste heat near the flash memory by decreasing the speed of an exhaust fan that removes the waste heat from the flash memory. The fan may be near or on the flash memory. In some examples, the flash memory may be in a separate compartment. The temperature adjuster 446 can control a heat gate that is to provide waste heat from the system to the compartment in response to detecting or predicting the write event. In some examples, the temperature adjuster 446 can cause a processor to execute additional instructions to increase the waste heat. For example, the temperature adjuster 446 can disable a processor throttling or provide additional instructions for an idle processor to execute. In some examples, the temperature adjuster 446 can control an active cooling device 441 at the flash memory. For example, the active cooling device 441 may be a thermoelectric cooling device, such as a refrigerator that utilizes the Peltier effect. In some examples, the cooling device 441 may be a passive cooling device, such as a heat sink or a heat pipe. For example, the cooling device 441 may be a vapor chamber coupled to both the flash memory and at least one other waste heat emitting device, such as a processor. The active cooling device 441 may also be a fan installed on a heatsink that is thermally coupled to the flash memory. In some examples, the temperature adjuster 446 can cause the temperature at the flash memory to decrease in response to detecting the end of the write event. For example, the temperature adjuster 446 can cause a processor throttling to resume to return the temperature to a predetermined normal operating temperature. The data writer 448 can write data to the flash memory at the increased temperature to increase the retention time of the data stored in the flash memory.

It is to be understood that the block diagram of FIG. 4 is not intended to indicate that the computing system 402 is to include all of the components shown in FIG. 4. Rather, the computing system 402 can include fewer or additional components not illustrated in FIG. 4 (e.g., additional applications, additional program elements, additional memory devices, additional network interfaces, etc.). Furthermore, any of the functionalities of the event detector 442, the temperature calculator 444, the temperature adjuster 446, or the data writer 448, may be partially, or entirely, implemented in hardware and/or in the processor 404. For example, the functionality may be implemented with an application specific integrated circuit, in logic implemented in the processor 404, or in any other device.

Figure 5:
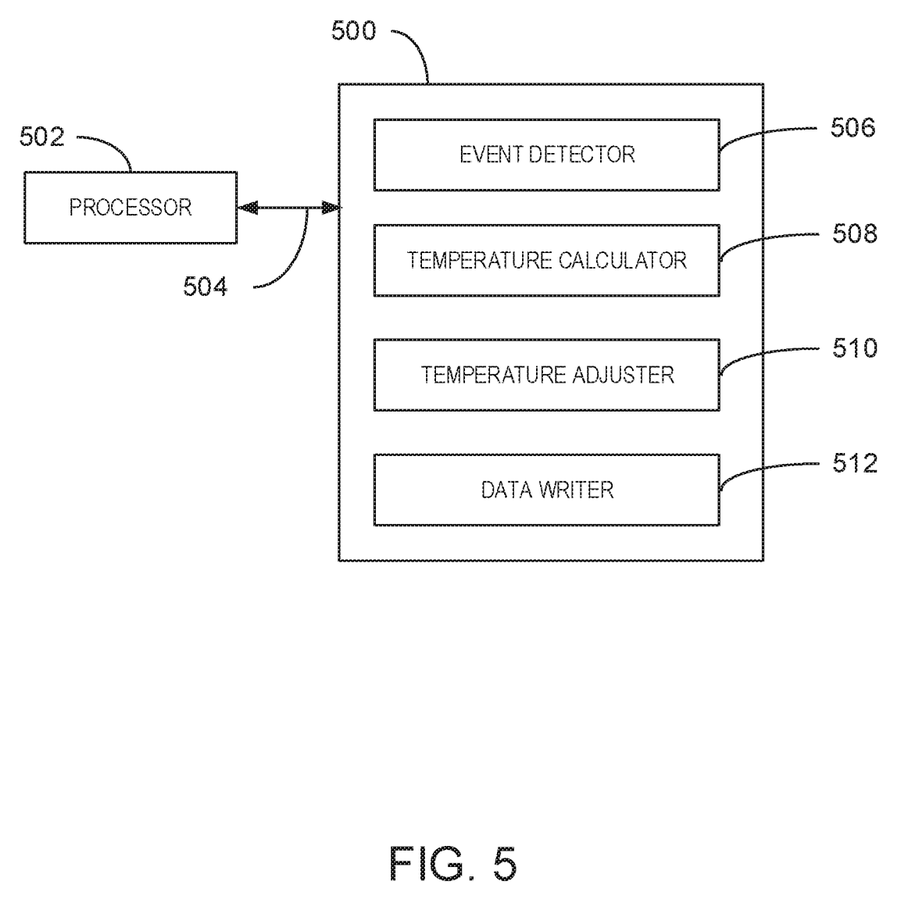
FIG. 5 is a block diagram of an example computer-readable storage media that can increase flash memory retention time using waste heat.

FIG. 5 is a block diagram of an example computer-readable storage media that can increase flash memory retention time using waste heat. The tangible, computer-readable storage media 500 may be accessed by a processor 502 over a computer bus 504. Furthermore, the tangible, computer-readable storage media 500 may include code to direct the processor 502 to perform the steps of the current methods.

The various software components discussed herein may be stored on the tangible, computer-readable storage media 500, as indicated in FIG. 5. For example, the tangible computer-readable storage media 500 can include an event detector 506, a temperature calculator 508, a temperature adjuster 510, and a data writer 512. In some embodiments, the event detector 506 can detect or predict a write event associated with a flash memory. In some examples, the event detector 506 can also detect an end of the write event.

In some examples, the temperature calculator 508 can determine a write temperature. For example, the write temperature may be greater than a first determined threshold and less than a second determined threshold. In some examples, the write temperature may be determined based on detected number of flash writes to be performed, or a current status of a thermal source of the waste heat, an age of the flash memory, or any combination thereof. In some examples, the threshold temperatures to be used may be determined using a table.

The temperature adjuster 510 can control a device to cause a temperature at the flash memory to increase via waste heat in response to the write event. In some examples, the device may be a fan. For example, the temperature adjuster 510 can reduce a speed of a fan in the system. For example, the temperature adjuster 510 can increase the waste heat near the flash memory by decreasing the speed of an exhaust fan that removes the waste heat from the flash memory. The fan may be near or on the flash memory. In some examples, the temperature adjuster 510 can cause a processor to execute additional instructions to increase the waste heat. For example, the temperature adjuster 510 can disable a processor throttling or provide additional instructions for an idle processor to execute. In some examples, the device may be an active cooling device. For example, the temperature adjuster 510 can control an active cooling device at the flash memory. For example, the active cooling device may be a thermoelectric cooling device, such as a refrigerator that utilizes the Peltier effect. The active cooling device may also be a variable conductance heat pipe. The active cooling device may also be a fan installed on a heatsink that is thermally coupled to the flash memory. In some examples, the temperature adjuster 510 can cause the temperature at the flash memory to decrease in response to detecting the end of the write event. For example, the temperature adjuster 510 can cause a processor throttling to resume to return the temperature to a predetermined normal operating temperature. The data writer 512 can write data to the flash memory at the increased temperature to increase the retention time of the data stored in the flash memory.

It is to be understood that any number of additional software components not shown in FIG. 5 may be included within the tangible, computer-readable storage media 500, depending on the specific application.

Example 1

In one embodiment, a system for increasing data retention time can include a processor to execute code to detect or predict a write event associated with a flash memory. The processor can also control a device in the system to cause a temperature at the flash memory to increase via waste heat in response to the write event. Additionally, the processor can write data to the flash memory at the increased temperature to increase the retention time of the data stored in the flash memory.

Alternatively, or in addition, the system may include a sensor to measure the temperature at the flash memory. The sensor may be located on a die of the flash memory. Alternatively, or in addition, the system may include a sensor to measure the temperature at the flash memory. The sensor may be located proximate to the flash memory. Alternatively, or in addition, the device includes a cooling device coupled to the flash memory. The processor may control the cooling device to increase the temperature of the flash memory. Alternatively, or in addition, the write event may include a game download, an application download, or an operating system update comprising a data size exceeding a threshold size. Alternatively, or in addition, the system may include a separate compartment for the flash memory. The device may include a heat gate that is to provide waste heat from the system to the compartment in response to detecting or predicting the write event. Alternatively, or in addition, the processor is to increase the temperature to exceed a predetermined threshold based on a detected number of flash writes to be performed, a current status of a thermal source of the waste heat, an age of the flash memory, or any combination thereof.

Example 2

In another embodiment, a method for increasing data retention time can include detecting or predicting, via a processor, a write event associated with a flash memory. The method can also include controlling, via the processor, a device to cause a temperature at the flash memory to increase via waste heat in response to the write event. Additionally, the method can include writing, via the processor, data to the flash memory at the increased temperature to increase the retention time of the data stored in the flash memory.

Alternatively, or in addition, the method may include detecting an end of the write event and controlling the device to cause the temperature at the flash memory to decrease in response to detecting the end of the write event. Alternatively, or in addition, controlling the device to cause the temperature to increase may include reducing, via the processor, a speed of a fan in the system. Alternatively, or in addition, controlling the device to cause the temperature to increase may include executing additional instructions via the processor. The waste heat may be generated at least in part by the processor. Alternatively, or in addition, controlling the device to cause the temperature to increase may include controlling, via the processor, an active cooling device at the flash memory. Alternatively, or in addition, controlling the device to cause the temperature to increase may include increasing the temperature to a write temperature above a first predetermined threshold temperature and below a second predetermined threshold temperature. Alternatively, or in addition, controlling the device to cause the temperature to increase may include determining, via the processor, a write temperature based on a detected number of flash writes to be performed. Alternatively, or in addition, controlling the device to cause the temperature to increase may include determining, via the processor, a write temperature based on a status of a thermal source of the waste heat.

Example 3

In yet another embodiment, one or more computer-readable storage media for increasing data retention time can include a plurality of instructions that, in response to execution by a processor, cause the processor to detect or predict a write event associated with a flash memory. The plurality of instructions can also cause the processor to control a device to cause a temperature at the flash memory to increase via waste heat in response to the write event. Additionally, the plurality of instructions can cause the processor to write data to the flash memory at the increased temperature to increase the retention time of the data stored in the flash memory.

Alternatively, or in addition, the plurality of instructions can cause the processor to detect an end of the write event and cause the temperature at the flash memory to decrease in response to detecting the end of the write event. Alternatively, or in addition, the device may include a fan in the system and the plurality of instructions may include code to reduce a speed of the fan. Alternatively, or in addition, the plurality of instructions can cause the processor to execute additional instructions to increase the waste heat. Alternatively, or in addition, the device may include an active cooling device at the flash memory.

Example 4

In one embodiment, a system for increasing data retention time can include a means for detecting or predicting a write event associated with a flash memory. The system can also include means for controlling a device in the system to cause a temperature at the flash memory to increase via waste heat in response to the write event. Additionally, the system may include means for writing data to the flash memory at the increased temperature to increase the retention time of the data stored in the flash memory.

Alternatively, or in addition, the system may include means for measuring the temperature at the flash memory. The means for measuring the temperature may be located on a die of the flash memory. Alternatively, or in addition, the system may include means for measuring the temperature at the flash memory. The means for measuring the temperature may be located proximate to the flash memory. Alternatively, or in addition, the device includes a means for cooling the flash memory coupled to the flash memory. A processor may control the means for cooling the flash memory to increase the temperature of the flash memory. Alternatively, or in addition, the write event may include a game download, an application download, or an operating system update comprising a data size exceeding a threshold size. Alternatively, or in addition, the system may include a separate compartment for the flash memory. The means for cooling the flash memory may include a heat gate that is to provide waste heat from the system to the compartment in response to detecting or predicting the write event. Alternatively, or in addition, the system may include means for increasing the temperature to exceed a predetermined threshold based on a detected number of flash writes to be performed, a current status of a thermal source of the waste heat, an age of the flash memory, or any combination thereof.

In particular and in regard to the various functions performed by the above described components, devices, circuits, systems and the like, the terms (including a reference to a "means") used to describe such components are intended to correspond, unless otherwise indicated, to any component which performs the specified function of the described component, e.g., a functional equivalent, even though not structurally equivalent to the disclosed structure, which performs the function in the herein illustrated exemplary aspects of the claimed subject matter. In this regard, it will also be recognized that the innovation includes a system as well as a computer-readable storage media having computer-executable instructions for performing the acts and events of the various methods of the claimed subject matter.

There are multiple ways of implementing the claimed subject matter, e.g., an appropriate API, tool kit, driver code, operating system, control, standalone or downloadable software object, etc., which enables applications and services to use the techniques described herein. The claimed subject matter contemplates the use from the standpoint of an API (or other software object), as well as from a software or hardware object that operates according to the techniques set forth herein. Thus, various implementations of the claimed subject matter described herein may have aspects that are wholly in hardware, partly in hardware and partly in software, as well as in software.

The aforementioned systems have been described with respect to interaction between several components. It can be appreciated that such systems and components can include those components or specified sub-components, some of the specified components or sub-components, and additional components, and according to various permutations and combinations of the foregoing. Sub-components can also be implemented as components communicatively coupled to other components rather than included within parent components (hierarchical).

Additionally, it can be noted that one or more components may be combined into a single component providing aggregate functionality or divided into several separate sub-components, and any one or more middle layers, such as a management layer, may be provided to communicatively couple to such sub-components in order to provide integrated functionality. Any components described herein may also interact with one or more other components not specifically described herein but generally known by those of skill in the art.

In addition, while a particular feature of the claimed subject matter may have been disclosed with respect to one of several implementations, such feature may be combined with one or more other features of the other implementations as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements.

What is claimed is:

1. A system for increasing data retention time, comprising:
   a processor to execute code to:
   detect or predict a write event associated with a flash memory;
   control a device in the system to cause a temperature at the flash memory to increase, via waste heat, above a first threshold based on indicia corresponding to an age of the flash memory and in response to the write event including a data size exceeding a threshold size; and
   write data to the flash memory at the temperature that exceeds the first threshold to increase the data retention time of the data stored in the flash memory.

2. The system of claim 1, comprising a sensor to measure the temperature at the flash memory, wherein the sensor is located on a die of the flash memory.

3. The system of claim 1, comprising a sensor to measure the temperature at the flash memory, wherein the sensor is located at the flash memory.

4. The system of claim 1, wherein the device comprises a cooling device coupled to the flash memory, and wherein the processor is to control the cooling device to increase the temperature of the flash memory.

5. The system of claim 1, wherein the write event comprises a game download, an application download, or an operating system update.

6. The system of claim 1, wherein the system comprises a separate compartment for the flash memory, and wherein the device comprises a heat gate that is to provide waste heat from the system to the compartment in response to detecting or predicting the write event.

7. The system of claim 1, wherein the processor is further configured to increase the temperature to exceed a second threshold based on a detected number of flash writes to be performed, a current status of a thermal source of the waste heat, the age of the flash memory, or any combination thereof.

8. A method for increasing data retention time, comprising:
   detecting or predicting, via a processor, a write event associated with a flash memory;
   controlling, via the processor, a device to cause a temperature at the flash memory to increase, via waste heat, above a first threshold based on indicia corresponding to an age of the flash memory and in response to the write event including a data size exceeding a threshold size; and
   writing, via the processor, data to the flash memory at the temperature that exceeds the first threshold to increase the data retention time of the data stored in the flash memory.

9. The method of claim 8, comprising:
   detecting an end of the write event; and
   controlling the device to cause the temperature at the flash memory to decrease in response to detecting the end of the write event.

10. The method of claim 8, wherein controlling the device to cause the temperature to increase comprises reducing, via the processor, a speed of a fan in the system.

11. The method of claim 8, wherein controlling the device to cause the temperature to increase comprises executing additional instructions via the processor, wherein the waste heat is generated at least in part by the processor.

12. The method of claim 8, wherein controlling the device to cause the temperature to increase comprises controlling, via the processor, an active cooling device at the flash memory.

13. The method of claim 8, wherein controlling the device to cause the temperature to increase comprises increasing the temperature to a write temperature below a second threshold.

14. The method of claim 8, wherein controlling the device to cause the temperature to increase comprises determining, via the processor, a write temperature based on a detected number of flash writes to be performed.

15. The method of claim 8, wherein controlling the device to cause the temperature to increase comprises determining, via the processor, a write temperature based on a status of a thermal source of the waste heat.

16. One or more computer-readable storage media for increasing data retention time comprising a plurality of instructions that, in response to execution by a processor, cause the processor to:
- detect or predict a write event associated with a flash memory;
- control a device to cause a temperature at the flash memory to increase, via waste heat, above a first threshold based on indicia corresponding to an age of the flash memory and in response to the write event including a data size exceeding a threshold size; and
- write data to the flash memory at the temperature that exceeds the first threshold to increase the data retention time of the data stored in the flash memory.

17. The one or more computer-readable storage media of claim 16, the computer-readable instructions comprising code to detect an end of the write event and cause the temperature at the flash memory to decrease in response to detecting the end of the write event.

18. The one or more computer-readable storage media of claim 16, wherein the device comprises a fan in the system, the computer-readable instructions comprising code to reduce a speed of the fan.

19. The one or more computer-readable storage media of claim 16, the computer-readable instructions comprising code to execute additional instructions to increase the waste heat.

20. The one or more computer-readable storage media of claim 16, wherein the device comprises an active cooling device at the flash memory.

* * * * *